(12) United States Patent
Drmosh et al.

(10) Patent No.: US 9,809,871 B1
(45) Date of Patent: *Nov. 7, 2017

(54) SILVER NANOPARTICLE METHOD ON ZINC OXIDE FILMS

(71) Applicant: KING FAHD UNIVERSITY OF PETROLEUM AND MINERALS, Dhahran (SA)

(72) Inventors: Qasem Ahmed Drmosh, Dhahran (SA); Mohammad Kamal Hossain, Dhahran (SA); Nouar Amor Tabet, Doha (QA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 15/658,068

(22) Filed: Jul. 24, 2017

Related U.S. Application Data

(63) Continuation of application No. 14/632,316, filed on Feb. 26, 2015, now Pat. No. 9,745,645.

(51) Int. Cl.
*C23C 14/18* (2006.01)
*C22C 5/06* (2006.01)
(Continued)

(52) U.S. Cl.
CPC .............. *C22C 5/06* (2013.01); *B22F 1/0018* (2013.01); *C22F 1/14* (2013.01); *C23C 14/086* (2013.01);
(Continued)

(58) Field of Classification Search
None
See application file for complete search history.

(56) References Cited

U.S. PATENT DOCUMENTS 5,460,704 A   10/1995 Davis
6,413,794 B1 * 7/2002 Sano ............... H01L 31/022466
                                                           438/96
(Continued)

FOREIGN PATENT DOCUMENTS

CN         101270468 B    9/2008

OTHER PUBLICATIONS

Hossain et al., "Silver nanoparticles on Zinc Oxide thin film: An insight in fabrication and characterization", IOP Conf. Series: Materials Science and Engineering 64 (2014), 2nd International Conference on Structural Nano Composites (NANOSTRUC 2014).

(Continued)

*Primary Examiner* — George Wyszomierski
(74) *Attorney, Agent, or Firm* — Oblon, McClelland, Maier & Neustadt, L.L.P.

(57) ABSTRACT

A method of preparing silver nanoparticles, including silver nanorings. A zinc oxide thin film is formed initially by direct-current sputtering of a zinc target onto a substrate. A silver thin film is then formed by a similar sputtering technique, of a silver target onto the zinc oxide thin film. After that, the silver thin film is subject to an annealing treatment. The temperature, duration and atmosphere of the annealing treatment can be varied to control the average particle size, average distance between particles (density), particle size distribution of the silver nanoparticles. In at least one embodiment, silver nanoparticles of ring structure are produced.

5 Claims, 9 Drawing Sheets

(51) Int. Cl.
   *C22F 1/14* (2006.01)
   *B22F 1/00* (2006.01)
   *C23C 14/58* (2006.01)
   *C23C 14/08* (2006.01)

(52) U.S. Cl.
   CPC ........ *C23C 14/185* (2013.01); *C23C 14/5806* (2013.01); *B22F 1/0014* (2013.01); *B22F 2001/0037* (2013.01)

(56) References Cited

U.S. PATENT DOCUMENTS

| | | | |
|---|---|---|---|
| 9,745,645 B2 * | 8/2017 | Drmosh | ............... C23C 14/086 |
| 9,773,931 B2 * | 9/2017 | Hossain | ............ H01L 31/02366 |
| 2008/0296567 A1 | 12/2008 | Irving et al. | |
| 2010/0300522 A1 | 12/2010 | Ginley et al. | |
| 2011/0308598 A1 | 12/2011 | Girotto | |
| 2014/0346499 A1 | 11/2014 | Kato | |
| 2015/0014627 A1 * | 1/2015 | Yu | ..................... H01L 27/14665 257/13 |
| 2016/0343887 A1 | 11/2016 | Hossain et al. | |

OTHER PUBLICATIONS

Fujimaki et al., "Formation and Molecular Sensing Property of Silver Nanoparticles from Sputtered Silver Oxide Layers", MRS Proceedings, vol. 876, 2005.

Ye, J. et al., "Observation of plasmonic dipolar anti-bonding mode in silver nanoring structures", Nanotechnology, vol. 20, Online at stacks.iop.org/Nano/20/465203, Published Oct. 22, 2009.

\* cited by examiner

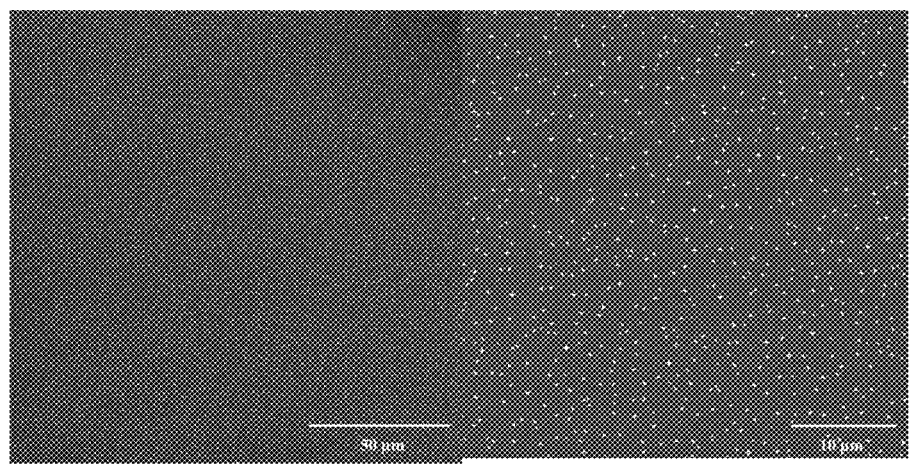
FIG. 5A   FIG. 5B
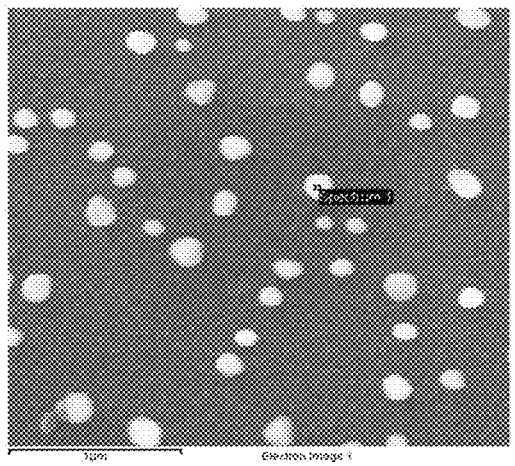 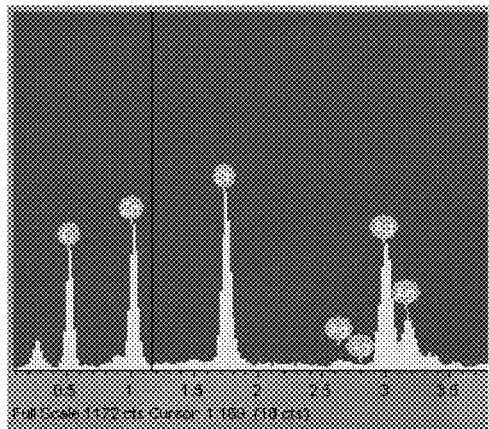
FIG. 5C   FIG. 5D

SILVER NANOPARTICLE METHOD ON ZINC OXIDE FILMS

CROSS-REFERENCE TO RELATED APPLICATIONS

The present application is a continuation of Ser. No. 14/632,316, having a filing date of Feb. 26, 2015, now U.S. Pat. No. 9,745,645.

BACKGROUND OF THE INVENTION

Technical Field

The present invention relates to a method of preparing silver nanoparticles. Specifically, the present invention relates to a method involving sputtering and annealing to form silver nanoparticles on a zinc oxide thin film surface wherein the average particle size, particle size distribution, density and shape can be controlled and manipulated. The silver nanoparticles can be used in applications including gas sensing, solar cells and photocatalysis.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Metal nanoparticles exhibit unprecedented and exciting properties strongly dependent on their size, shape and inherent electrons distribution with reference to those of macro-scaled counterpart (G. L. Hornyak, H. F. Tibbals, J. Dutta and J. J. Moore, Introduction to Nanoscience and Nanotechnology, CRC Press of Taylor and Francis Group LLC, ISBN-13: 9781420047790 (2008)—incorporated herein by reference in its entirety). Thus, their applications in medicine, sensors, cosmetics, renewable energies, oncology, etc. are revolutionary in our modern science and technology (G. L. Hornyak, H. F. Tibbals, J. Dutta and J. J. Moore, Introduction to Nanoscience and Nanotechnology, CRC Press of Taylor and Francis Group LLC, ISBN-13: 9781420047790 (2008); J. Dutta and H. Hofmann, Self-Organization of Colloidal Nanoparticles, Encyclopedia of Nanoscience & Nanotechnology, 9, 617 (2004); M. De, P. S. Ghosh and V. M. Rotello, Adv. Mater., 20, 4225 (2008); A-HI. Lu, E. L. Salabas and S. Ferdi, Angew. Chem. Int. Ed. Engl., 46, 1222 (2007); C. R Ghosh and Paria S, Chem. Rev., 112, 2373 (2012)—each incorporated herein by reference in its entirety). Amongst the different types of metal nanoparticles, silver nanoparticles (Ag-NPs) are known for their unique physical, chemical and biological properties. Enhanced electrical and thermal conductivity, surface-enhanced Raman scattering, chemical stability, catalytic activity, enhanced photocurrent induction, etc. are some of distinguished physico-chemical properties of Ag-NPs responsible for their potential value in microelectronics, sensing, optoelectronics, corrosion and biomedical (A. H. Alshehri, M. Jakubowska, A. Mlozniak, M. Horaczck, D. Rudka, C. Free and J. D. Carey, Appl. Mater. Interfaces, 4, 7007 (2012); C-W. Chou, S-H. Hsu, H. Chang, S-M. Tseng and H-R. Lin, Poly. Deg. and Stab. 91, 1017 (2006); M. K. Hossain, Mat. Sci. Forum, 754, 143 (2013); M. K. Hossain, G. R. Willmott, P. G. Etchegoin, R. J. Blaikie and J. L. Tallon, NanoScale, 5, 8945 (2013); M Ahamed, M S Alsalhi and M K Siddiqui, Clin. Chim. Acta, 411, 1841 (2010)—each incorporated herein by reference in its entirety). Apart from these, Ag-NPs are can also be used in a wide range of consumer products such as plastics, soaps, pastes, food, textiles, etc. due to their excellent anti-bacterial and anti-fungal activity (J. Garcia-Barrasa, J. M. Lopez-de-luzuriaga and M. Monge., Cent. Eur. J. Chem., 9, 17 (2011); J. Fabrega, S. N. Luoma, C. R. Tyler, T. S. Galloway and J. R. Lead, Environ. Intert., 37, 517 (2011); P. Dallas, V. K. Sharma and R. Zboril, Adv. Colloid Interface Sci., 166, 119 (2011); J. Turkevich, P. C. Stevenson and J. Hillier, Discuss. Faraday. Soc., 11, 55 (1951)—each incorporated herein by reference in its entirety).

Most of the Ag-NP synthesis methods that have been reported so far employ chemical, physical and photochemical routes. Every route carries some pros and cons with common issues such as costs, uniformity, scalability, purity, etc.

Generally, three main components are involved in the wet chemical synthesis method: (i) metal salts, (ii) reducing agents and (iii) surfactants or stabilizing agents (J. Kimling, M. Maier, B. Okenve, V. Kotaidis, I I. Ballot and A. Plech, J. Phys. Chem. B, 110, 15700 (2006); M. Brust, M. Walker, D. Bethell, D. J. Schiffrin and R. Whyman, Chem. Commun., 7, 801 (1994); A. Manna, P. Chen, H. Akiyama, T. Wei, K. Tamada and W. Knoll, Chem. Mater., 15, 20 (2003); S. D. Perrault and W. C. W. Chan, J. Am. Chem. Soc., 131, 17042 (2009); A. J. Christy and M. Umadevi, Adv. Nat. Sci.: Nanosci. Nanotechnol. 3, 035013 (2012); S. K. Ghosh, S. Kundu, M. Mandal, S. Nath and T. Pal, J. Nanopart. Res., 5, 577 (2003)—each incorporated herein by reference in its entirety). The formation of colloids from the reduction of silver salts involves two stages, viz. nucleation and subsequent nanoparticles growth thereof. Therefore, purity, cost and other issues remain the same.

The photo-induced synthetic strategies generally consist of two approaches; (i) photo-physical (e.g. laser ablation) and (ii) photochemical (e.g. microwave-assisted). In laser ablation, the NPs are synthesized through break-down of bulk metals into nanoscale particles, whereas photochemical route gets NPs into ionic precursors. In brief, the NPs are formed by direct photoreduction of a metal source or reduction of metal ions using photo-chemically generated intermediates (J. Siegel, O. Kvitek, P. Ulbrich, Z. Kolska, P. Slepicka and V. Svorcik, Mater. Lett., 89, 47 (2012); Z. A. Lewicka, Y. Li, A. Bohloul, W. W. Yu, V. L. Colvin, Nanotechnology, 24, 115303 (2013)—each incorporated herein by reference in its entirety). In such techniques, purity, scalability and uniformity pose great challenges.

For a physical approach, the metallic NPs can be generally synthesized by evaporation-condensation, thermal-decomposition, arc discharge, etc. Narrow size distribution and almost zero contamination probability are the two key advantages in this approach with reference to other routes. The physical synthesis process of Ag-NPs usually utilizes external energy (in form of thermal, ac power, arc discharge) to produce Ag-NPs with nearly narrow size distribution (H. Liu, X. Zhang, and T. Zhai, Opt Express, 21, 15314 (2013)—incorporated herein by reference in its entirety). The physical approach can produce large quantities of Ag-NPs samples in a single process. This method is also useful in producing Ag-NPs with different sizes and shapes. However, primary costs for investment of equipment are very high.

In addition, fabrication of metal nanorings has been reported by various methods such as lithography, molecular-beam epitaxy, template-assisted deposition, etc. (S. L. Teo, V. K. Lin, R. Marty, N. Large, E. A.n Llado, A. Arbouct, C. Girard, J. Aizpurua, S. Tripathy, and A. Mlayah, Opt Express 18, 22271 (2010); K. L. Hobbs, P. R. Larson, G. D. Lian, J. C. Keay, and M. B. Johnson, Nano Lett., 4, 167 (2004); C. Eminian, F.-J. Haug, O. Cubero, X. Niquille and C. Ballif, Prog. Photovolt: Res. Appl., 19, 260 (2011); H. A. Atwater and A. Polman, Nature Mat., 9, 205 (2010)—each incorporated herein by reference in its entirety).

Template-assisted technique and complicated methods and/or sophisticated facilities are usually required to fabricate such metal nanorings. In such scenarios, particles are surrounded by surfactants and thus applications such as sensing and catalytic cannot be realized because of unexpected analytes around these nanoparticles. Pillai et al. showed that embedding silver nanoparticles in the ZnO layer at the back contact of amorphous silicon solar cells leads to a 20% increase of the photocurrent (S. Pillai, K. R. Catchpole, T. Trupke, and M. A. Green, J. Appl. Phys., 101, 093105 (2007)—incorporated herein by reference in its entirety). Such improvement of device performance by metallic nanoparticles has been attributed to the induction of localized surface plasmons and light scattering that lead to enhanced light trapping (E. Thouti, N. Chander, V. Dutta and V. K. Komarala, J. Opt., 15, 035005 (2013); S. Dengler, C. Kilbel, A. Schwenke, G. Ritt, B. Eberle, J. Opt. 14, 075203 (2012)—each incorporated herein by reference in its entirety). Various studies have shown the importance of nanoparticle size control, the morphology and the average distance between nanoparticles area in order to enhance their effect on light scattering (K. Sivaramakrishnan, A. T. Ngo, S. Iyer, and T. L. Alford J. Appl. Phys. 105, (2009)—incorporated herein by reference in its entirety).

In view of the foregoing, a non-limiting objective of the present invention is to provide simple methods of synthesizing Ag-NPs including Ag nanorings of high purity with uniform distribution or dispersion, wherein the size and the density of the NPs (i.e. number of NPs per unit area) can be controlled.

BRIEF SUMMARY OF THE INVENTION

According to a first aspect, the present invention relates to a method of forming silver nanoparticles. The method comprises forming a silver film on a zinc oxide film and annealing the silver film to form the silver nanoparticles from the silver film. The annealing is carried out at a temperature of 200-700° C. for a duration of 3-24 hours under an atmosphere of argon, nitrogen or air.

In one or more embodiments, the method further comprises forming the zinc oxide film by direct-current sputtering zinc onto a substrate under reactive oxygen plasma.

In one or more embodiments, the method further comprises isolating the silver nanoparticles from the zinc oxide film.

In one or more embodiments, the silver film is formed by direct-current sputtering of silver on the zinc oxide film under argon plasma.

In one or more embodiments, the silver nanoparticles formed by the annealing have an average particle size of 20-350 nm and the average size of the silver nanoparticles increases with the temperature.

In one or more embodiments, the silver nanoparticles formed by the annealing have an average distance between particles of 350-3500 nm and the average distance between particles decreases with the temperature.

In one or more embodiments, the silver nanoparticles formed by the annealing have a unimodal, bimodal or multimodal particle size distribution.

In one or more embodiments, the annealing is carried out at 500-700° C. for 5-7 hours under nitrogen to form silver nanoparticles of ring structure having an inner diameter of 250-600 nm, an outer diameter of 1000-1200 nm and a ring wall thickness of 70-90 nm.

Further, the present invention relates to a silver nanoparticle or a silver nanoring prepared with the method according to the first aspect of the invention.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 5A illustrates a uniform distribution of Ag nanoparticles obtained after 4 h of annealing under Ar in a sputtering chamber at 700° C. at 1.79 kx magnification.

FIG. 5B illustrates a uniform distribution of Ag nanoparticles obtained after 4 h of annealing under Ar in a sputtering chamber at 700° C. at 10 kx magnification.

FIG. 5C is an EDX image of the Ag nanoparticles on ZnO obtained after 4 h of annealing under Ar in a sputtering chamber at 700° C. and used for the FEDEM-EDX analysis.

FIG. 5D is a FESEM-EDX spectrum of the Ag nanoparticles on ZnO obtained after 4 h of annealing under Ar in a sputtering chamber at 700° C. and used for the FEDEM-EDX analysis.

DETAILED DESCRIPTION OF THE EMBODIMENTS

Figure 1:
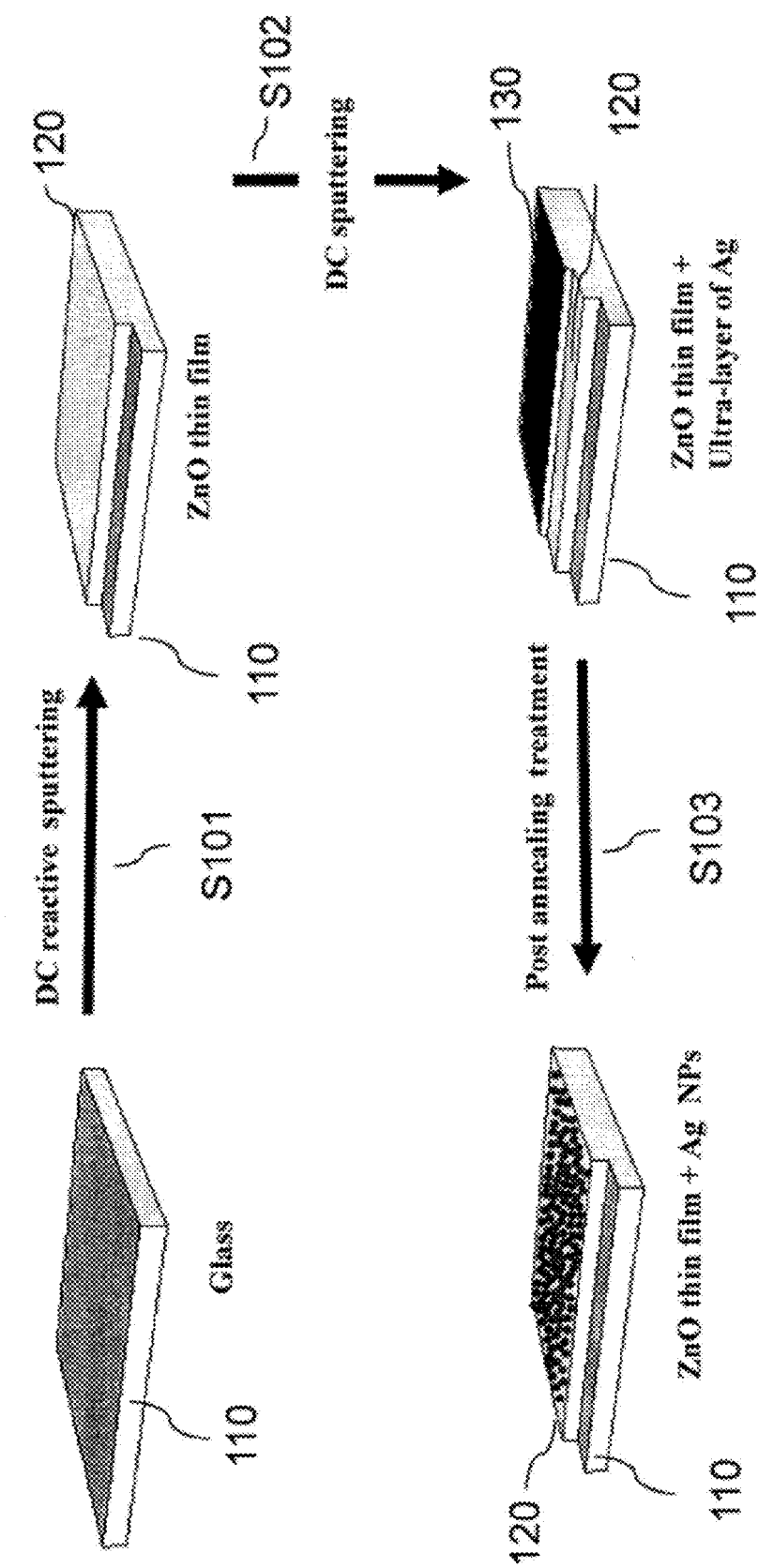
FIG. 1 is schematic diagram illustrating a process of fabricating Ag-NPs and Ag nanorings according to one embodiment.

Referring now to the drawings, wherein like reference numerals designate identical or corresponding parts throughout the several views.

The present invention relates to a method of synthesizing Ag nanoparticles (Ag-NPs). The method allows the average particle size, the average space or distance between nanoparticles (density), the particle size distribution of the Ag-NPs to be controlled and manipulated, and contamination to be minimized during the synthesis process.

According to a preferred embodiment, the method of synthesizing Ag-NPs includes techniques such as sputtering (for etching and thin film deposition) and annealing (for formation of Ag-NPs).

For purposes of the invention, "sputtering" is a process whereby atoms, such as metallic atoms, are ejected from a solid target material due to bombardment of the target by energetic particles of a gas or a plasma in a vacuum chamber (sputtering chamber). As used herein, metallic thin films or layers are prepared and deposited onto a substrate material by direct-current or DC sputtering. For example, a ZnO thin film can be prepared by etching and sputtering of a zinc target of at least 99.9% purity onto a substrate or a surface in the presence of a reactive gas or plasma such as $O_2$. Examples of the substrate include silicon wafer, glass, thermoplastic and any inert material that will not react with the ZnO film coating. A glass substrate used herein may have anti-reflective and self-cleaning properties. Alternatively, a glass substrate can be cleaned with ethanol. The ZnO thin film deposition time can range from 10-45 min, preferably 15-35 min, more preferably 20-30 min.

Subsequently and similarly, an Ag thin film can be prepared by etching and sputtering of an Ag target of at least 99.9% purity onto the ZnO thin film (now acting as a substrate) under Ar plasma. The Ag thin film deposition time can range from 5-60 s, preferably 5-45 s, more preferably 5-30 s.

As used herein, "thin film" refers to a monolayer or a plurality of layers comprising ZnO, Ag or mixtures thereof. The ZnO thin film can range, as measured by XPS analysis, from 25-1000 nm in thickness, preferably 50-850 nm, more preferably 50-800 nm, for example, 76 nm in one embodiment. On the other hand, the Ag thin film can range from 25-500 nm in thickness, preferably 25-250 nm, more preferably 10-100 nm, for example 12 nm according to one embodiment. The average height of Ag NPs was measured by atomic force microscopy (AFM) as 100-200 nm, for example, 150 nm according to one embodiment. Next, to form Ag-NPs, the Ag thin film sputtered on the ZnO thin film is subject to annealing treatment. Conditions of the annealing treatment such as annealing temperature, annealing duration and atmosphere are varied so that the size, size distribution and density (distance between Ag-NPs) of the Ag-NPs on the ZnO surface can be controlled.

For purposes of the present invention, "annealing" or "post-annealing" refers to a heat treatment in that alters the physical and sometimes chemical properties of a material, e.g. a metallic thin film, to increase ductility, soften the material, relieve internal stresses, refine the structure of the material by making it homogeneous, and improve hardening or cold working properties. Annealing is used in the present invention to form Ag-NPs from the Ag thin film layered on top of the ZnO thin film. Due to the proximity of the ZnO thin film to the Ag thin film, the physical and chemical properties of the ZnO thin film may also be altered during an annealing treatment.

In certain embodiments, the annealing temperature ranges from 100-1000° C., preferably 200-700° C., more preferably 400-700° C., even more preferably 500-600° C. In general, the density of the Ag-NPs decreases by increasing the annealing temperature. For example, the density of Ag-NPs can be reduced to an average distance of 1500 nm between particles from 350 nm when the annealing temperature is increased from 600° C. to 700° C. under Ar atmosphere and with an annealing duration of 4 h.

Also, by increasing the annealing temperature, the average particle size of Ag-NPs may be increased. For example, Ag-NPs obtained with a 4-h annealing under Ar atmosphere at 400° C. have average particle sizes of 20 nm and 100 nm (bimodal particle size distribution). When the annealing temperature is increased to 600° C., Ag-NPs of an average particle size of 150 nm are obtained (unimodal particle size distribution). With a further increase of the annealing temperature to 700° C., large and small Ag-NPs with the average particle sizes of 350 nm and 40-50 nm, respectively are formed (bimodal particle size distribution).

Ag-NPs synthesized according to various embodiments of the method described herein exhibit either a unimodal, bimodal or multimodal particle size distribution, which can be influenced not only by the annealing temperature, as set forth above, but also the atmosphere and the annealing duration. Annealing durations can range from 3-24 h. Overall, to achieve a uniform size distribution (unimodal or bimodal), a longer annealing duration is required, for example, more than 9 h, preferably more than 12 h, more preferably more than 15 h, even more preferably more than 20 h.

Further, the atmosphere under which Ag-NPs are annealed can affect the density or average distance between particles and the average particle size. Ag-NPs, according to the present invention, can be annealed under air, $N_2$ or in the presence of an inert gas such as Ar. When the annealing temperature and the annealing duration are maintained the same, Ag-NPs annealed under Ar flow are less dense than Ag-NPs annealed under air flow, with average distance between particles of 3500 nm and 600 nm, respectively. The average particle size of Ag-NPs annealed under Ar is 400-600 nm (preferably 450-550 nm, e.g. 500 nm) compared to the average particle size of 100-300 nm (preferably 150-250 nm, e.g. 200 nm) of Ag-NPs obtained under air.

In one or more embodiments, the method produces Ag nanorings. As used herein, a "nanoring" is a ring of crystalline material, i.e. Ag having a diameter measured on the nano scale. In one embodiment, Ag nanorings are formed on the ZnO thin after an annealing treatment at 500-700° C. (preferably 550-650° C., e.g. 600° C.) for 5-7 h (preferably 5.5-6.5 h, e.g. 6 h) under $N_2$. The Ag nanorings have an inner diameter of 250-600 nm (preferably 300-500 nm), an outer diameter of 1000-1200 nm (preferably 1000-1100 nm) and a ring wall thickness of 70-90 nm (preferably 78-82 nm).

The following examples are intended to further illustrate exemplary protocols for preparing Ag-NPs and characterizing the morphology (especially particle size and size distribution) of the prepared Ag-NPs, and are not intended to limit the scope of the claims.

Example 1

Synthesis of Ag-NPs

Thin layers of metallic silver were obtained by DC sputtering technique using an Automatic sputter coater (model NSC-4000).

Figure 2A:
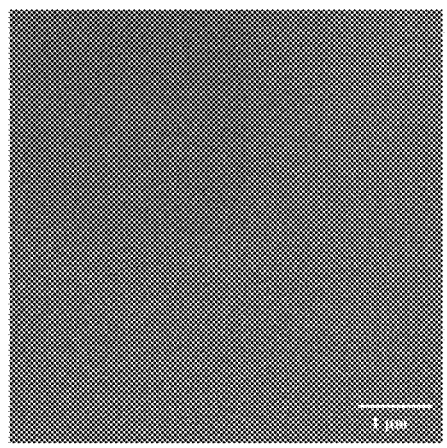
FIG. 2A is a scanning electron microscopy (SEM) micrograph of a zinc oxide (ZnO) thin film formed at step S101 of the fabrication process of FIG. 1.

Referring to FIG. 1, wherein a Ag-NP synthesis process 100 is depicted. At step S101, a ZnO thin film 120 was deposited onto a glass substrate 110 using reactive plasma of pure oxygen ($O_2$) and pure zinc target (99.999%). The deposition time was 25 minutes at 100 watt. FIG. 2A shows an SEM image of the ZnO thin film 120 formed at step S101.

At step S102, Ag was sputtered under pure Ar plasma using a pure silver target (99.99%) to form an Ag thin film 130 layered on top of the ZnO thin film 120. The deposition time ranged from 5 s to 25 s.

Before sputtering, the glass substrate 100 was cleaned using ethanol. The pure Zn and Ag targets were ultrasonicated for 15 min in acetone followed by 15 min ultrasonic cleaning in methanol.

Both steps S101 (sputtering of Zn) and S102 (sputtering of Ag) were carried out in a sputtering chamber. The base pressure in the sputtering chamber was less than $2\times10^{-6}$ torr and the working pressure was set to $7\times10^{-3}$ torr by adjusting the gas flow at 80 standard cubic centimeters per minute, sccm (Ar for silver deposition and pure $O_2$ for ZnO deposition). The zinc and silver targets were plasma etched for 1 min before each starting the deposition process. The target substrate distance was fixed at 10 cm.

Figure 2B:
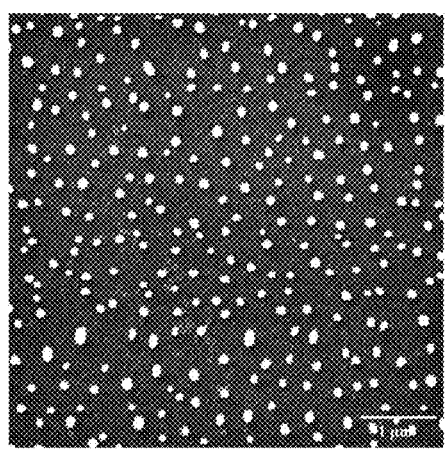
FIG. 2B is an SEM micrograph of Ag-NPs formed on a ZnO thin film at step S103 of the fabrication process of FIG. 1.
Figure 2C:
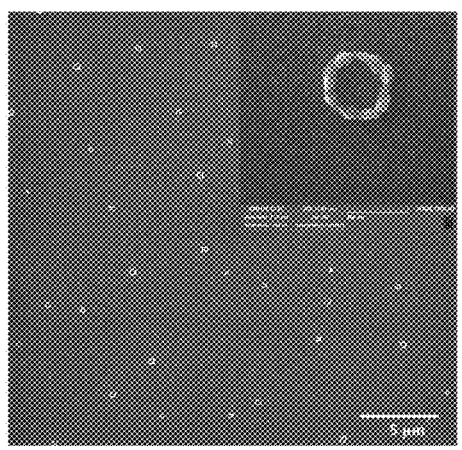
FIG. 2C is an SEM micrograph of Ag nanorings formed on a ZnO thin film at step S103 of the fabrication process of FIG. 1.

Subsequently, at step S103, the Ag thin film 130 was annealed either in the sputtering chamber or in a tube furnace (MTI OTF-1200X) at different temperatures ranging from 200° C. to 700° C. and for different durations ranging from 3 h to 24 h. The annealing of the Ag thin film 130 was performed under Ar atmosphere or in a tube furnace under air or under a constant flow rate of pure Ar or $N_2$. At the end of step S103, Ag-NPs were formed and dispersed on the ZnO thin film 120. FIGS. 2B and 2C show Ag-NPs and Ag nanorings formed on the ZnO thin film at step S103, respectively.

Example 2

X-Ray Photoelectron Spectroscopy (XPS) Analysis

After step S102, wherein Ag was deposited on the ZnO thin film 120 by DC sputtering, the Ag/ZnO thin film 130 product was examined and analyzed for purity with an XPS spectroscope (ESCALAB 250Xi).

Figure 3A:
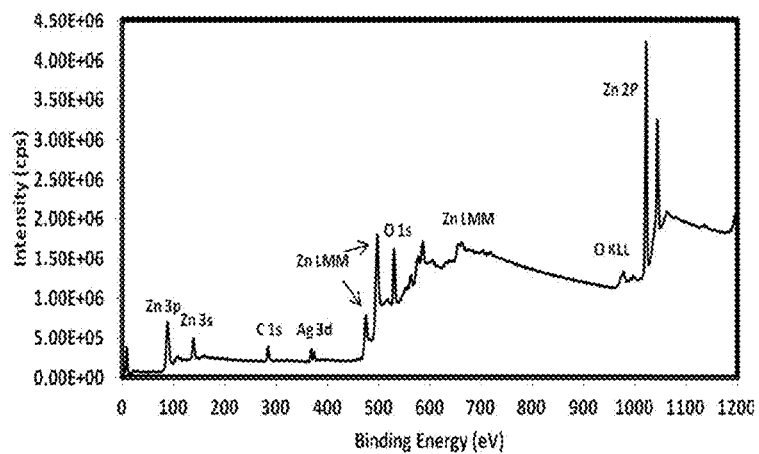
FIG. 3A is a wide scan XPS spectrum of the deposition of Ag on a ZnO thin film.
Figure 3B:
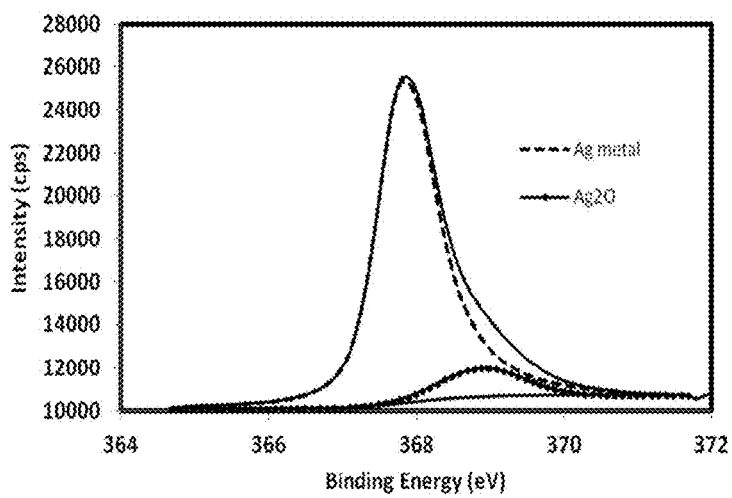
FIG. 3B is a high resolution Ag3d XPS spectrum of the deposition of Ag on a ZnO thin film.
Figure 3C:
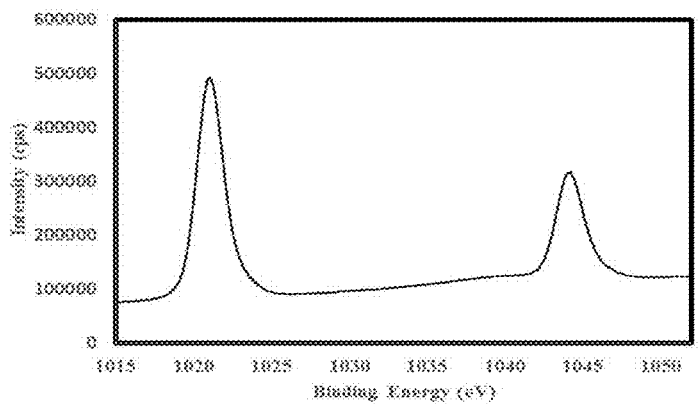
FIG. 3C is a Zn2p spectrum of the deposition of Ag on a ZnO thin film.

FIGS. 3A-3C show a wide scan spectrum, a high resolution Ag3d XPS spectrum and Zn2p spectra of the Ag/ZnO thin film 130 formed at step S102, respectively. The wide scan spectrum of FIG. 3A reflected the presence of Zn, O, Ag and C and no other contaminations were detected on the sample. The Ag3d XPS spectrum of FIG. 3B was fitted using two peaks, with the major peak centered at 367.8 eV being associated with metallic silver and the second peak at 368.9 eV probably associated with silver oxide ($Ag_2O$). As shown in FIG. 3C, the positions of the $Zn2p_{3/2}$ peak and $2p_{1/2}$ peak of the Ag/ZnO thin film 130 are 1021.18 eV and 1044.28 eV respectively, and they correspond to the peak positions of pure ZnO in the primary Zn2p XPS region.

Example 3

Morphological Studies of Ag-NPs Annealed Under Different Conditions

The Ag-NPs obtained from the synthesis process 100 were subject to morphological studies (particle size distribution, average particle size, density or average distance between particles, shape) using a Field emission scanning electron microscope (FESEM) (LYRA-3 Tescan).

Figures 4A, 4B:
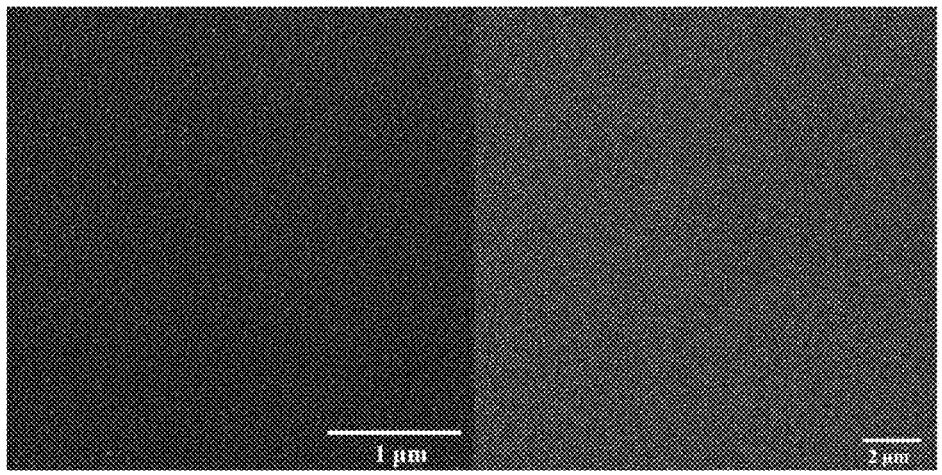
FIG. 4A is a field emission scanning electron microscope (FESEM) image of silver films after an annealing treatment at T=200° C. for 4 h under argon (Ar) atmosphere.
FIG. 4B is a field emission scanning electron microscope (FESEM) image of silver films after an annealing treatment at T=400° C. for 4 h under Ar atmosphere.

FIGS. 4A-4D are FESEM images of Ag-NPs after annealing treatments at T=200° C., 400° C., 600° C. and 700° C. for 4 h under Ar atmosphere. As shown in FIG. 4A, a relatively smooth surface was observed after 200° C. treatment.

As shown in FIG. 4B, a very dense distribution of circular Ag-NPs was obtained after a 400° C. annealing treatment. The size distribution of the Ag-NPs was very broad, with the average particle size ranging from about 20 nm to 100 nm.

Figures 4C, 4D:
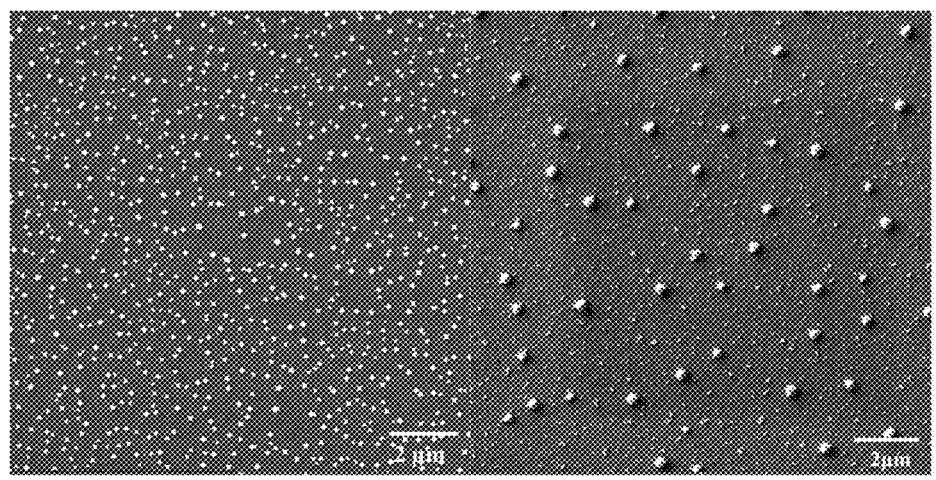
FIG. 4C is a field emission scanning electron microscope (FESEM) image of silver films after an annealing treatment at T=600° C. for 4 h under Ar atmosphere.
FIG. 4D is a field emission scanning electron microscope (FESEM) image of silver films after an annealing treatment at T=700° C. for 4 h under Ar atmosphere.

As seen in FIG. 4C, the annealing at 600° C. reduced the density of Ag-NPs to an average distance of 350 nm between particles. The size distribution was also narrowed to an average particle size of 150 nm.

After an annealing treatment at 700° C., low density, large spherical Ag-NPs of about 350 nm in diameter and separated by an average distance of about 1.5 μm or 1500 nm, were formed, as seen in FIG. 4D. These large, spherical Ag-NPs were surrounded by smaller nanoparticles of about 50 nm in diameter or less.

In the FESEM images of FIGS. 5A-5B, uniform distribution of Ag-NPs over the surface of the ZnO thin film 120 is shown in different magnifications, i.e. 1.79 k× and 10 k× respectively. These Ag-NPs were obtained after 4 h of annealing under Ar in a sputtering chamber at 700° C. An elemental analysis of the Ag-NPs was carried out by FESEM-aided EDX (FIGS. 5C and 5D). FIG. 5D shows the peaks for Zn, O and Si (from the glass substrate 110) in addition to Ag $L_\alpha$ and Ag $L_\beta$ peaks at 2.98 keV and 3.15 keV respectively. The positions of the Ag peaks coincide with the FESEM database as well as the values reported previously (Dengler, C. Kübel, A. Schwenke, G. Ritt, B. Eberle, J. Opt. 14, 075203 (2012)—incorporated herein by reference in its entirety).

Figure 6:
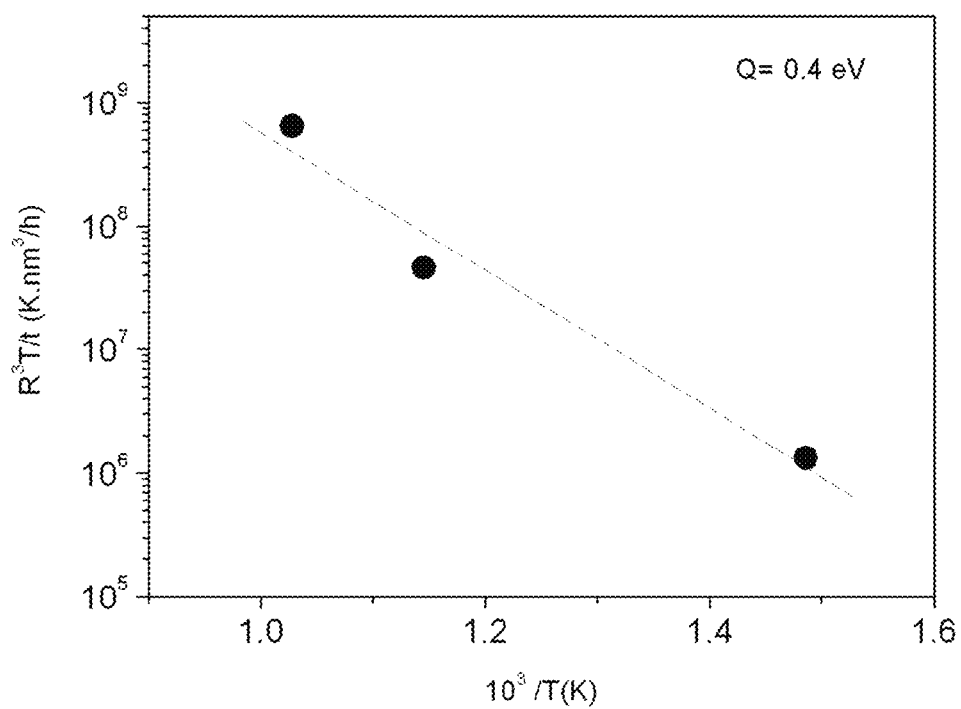
FIG. 6 is an Arrhenius plot of the growth of Ag nanoparticles obtained by annealing of Ag thin films under Ar atmosphere.

FIG. 6 is an Arrhenius plot of the growth of Ag-NPs obtained by an annealing treatment of the Ag/ZnO thin film 130 under Ar atmosphere. Assuming the growth process is controlled by the surface diffusion of silver, the model predicts a linear increase of the cube of the particle size, R, based on Equation 1:

$$K = \frac{dR^3}{dt} = \frac{K_0}{T}\exp\left(-\frac{Q}{kT}\right) \quad \text{(Equation 1)}$$

where T is the temperature, K the Boltzmann constant, $K_0$ is a constant and Q is the activation energy of the diffusion process. The Arrhenius plot of FIG. 6 shows a temperature dependence of the growth rate extracted from the experimental data. The value of activation energy, Q, is 0.4±0.1 eV. This value is in good agreement with the published value of 0.36 eV (K. Sivaramakrishnan, A. T. Ngo, S. Iyer, and T. L. Alford J. Appl. Phys. 105, (2009)—incorporated herein by reference in its entirety).

Figures 7A, 7B, 7C:
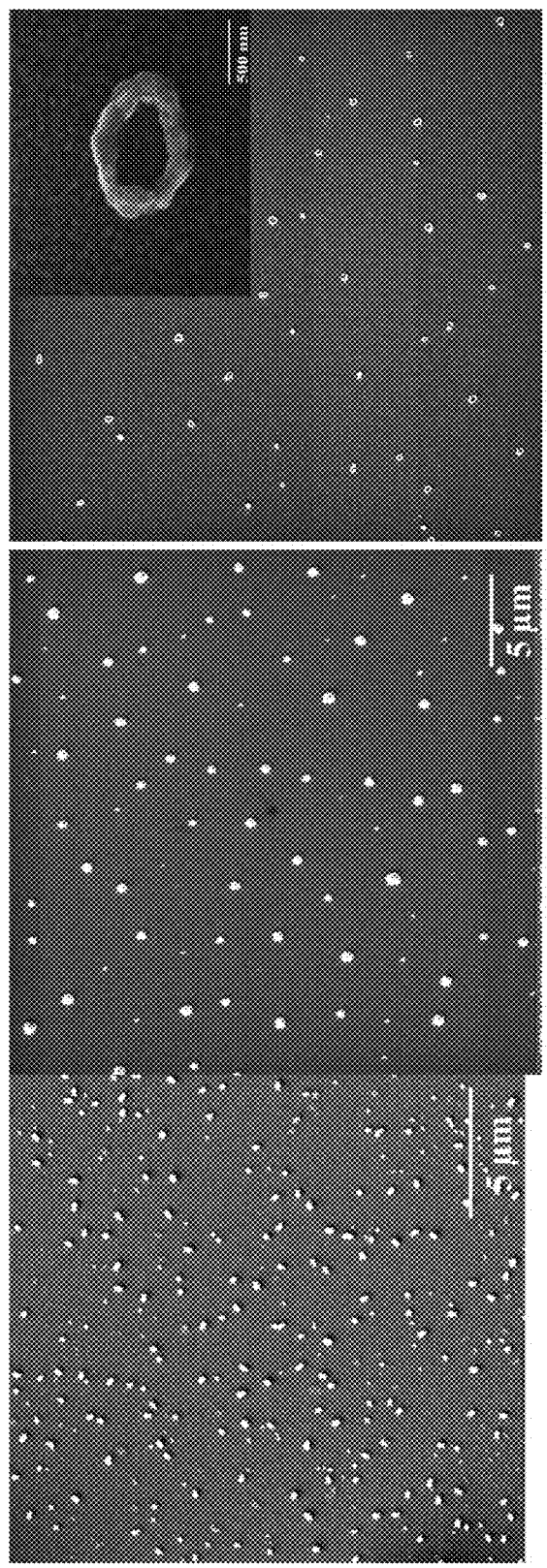
FIG. 7A illustrates the distribution of Ag-NPs obtained after 6 h of annealing at 600° C. under air.
FIG. 7B illustrates the distribution of Ag-NPs obtained after 6 h of annealing at 600° C. under pure Ar.
FIG. 7C illustrates the distribution of Ag nanorings obtained after 6 h of annealing at 600° C. under pure nitrogen.

FIGS. 7A-7C are FESEM images that illustrate the differences in the distribution of Ag-NPs, obtained after 6 h of annealing at 600° C. under air, Ar or $N_2$, respectively. The distribution of the nanoparticles obtained after annealing under air (FIG. 7A) is much denser than that observed under Ar (FIG. 7B). The average distance between particles obtained under flow of Ar (~3.5 μm) is about 6 times than that between particles obtained under air (~0.6 μm). In addition, the particle size obtained under air (~200 nm) is about 2.5 times smaller than that observed under Ar (~500 nm). FIG. 7C shows the formation of Ag nanorings after annealing under flow of pure $N_2$ for 6 h at 600° C. The inset in FIG. 7C shows that the Ag nanorings have an inner diameter of about 600 nm diameter and an outer diameter that slightly exceeds 1 μm or 1000 nm.

Figures 8A, 8B, 8C:
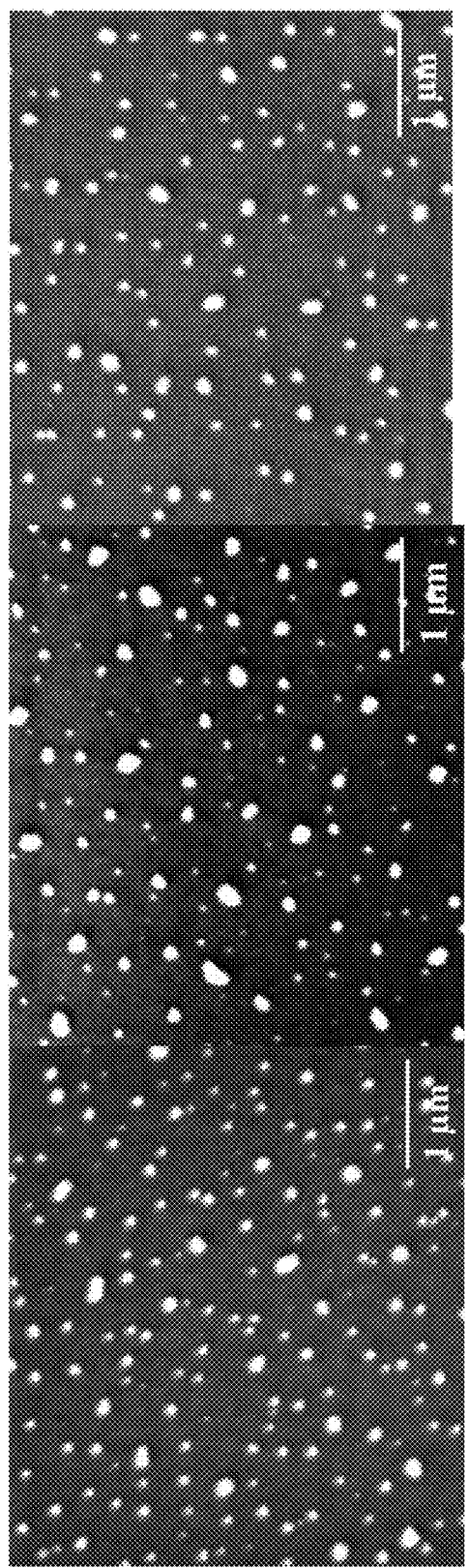
FIG. 8A illustrates the distribution of Ag-NPs after 3 h of total annealing durations
FIG. 8B illustrates the distribution of Ag-NPs after 9 h of total annealing durations.
FIG. 8C illustrates the distribution of Ag-NPs after 24 h of total annealing durations.

FIGS. 8A-8C are FESEM images that illustrate the differences in particle size distribution of Ag-NPs after 3 h, 9 h and 24 h of total annealing durations. FIGS. 8A and 8B show various size distributions of Ag-NPs after 3 h and 9 h of annealing, respectively. On the other hand, after 24 h of annealing, particles of small size have almost vanished, as shown in FIG. 8C and the Ag-NPs exhibit a bimodal or two-size particle size distribution.

Figure 9A:
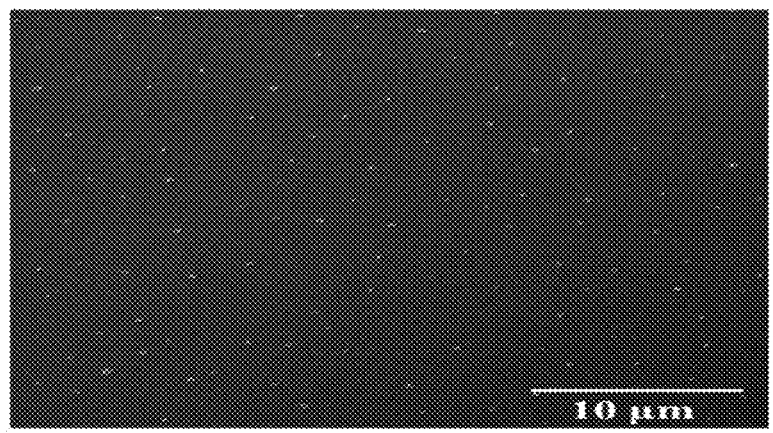
FIG. 9A illustrates the distribution of Ag nanorings at 8 kx magnification obtained after 6 h of annealing at 600° C. under pure nitrogen.
Figure 9B:
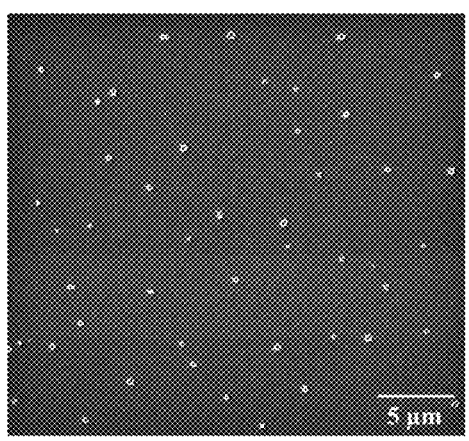
FIG. 9B illustrates the distribution of Ag nanorings at 10 kx magnification obtained after 6 h of annealing at 600° C. under pure nitrogen.
Figure 9C:
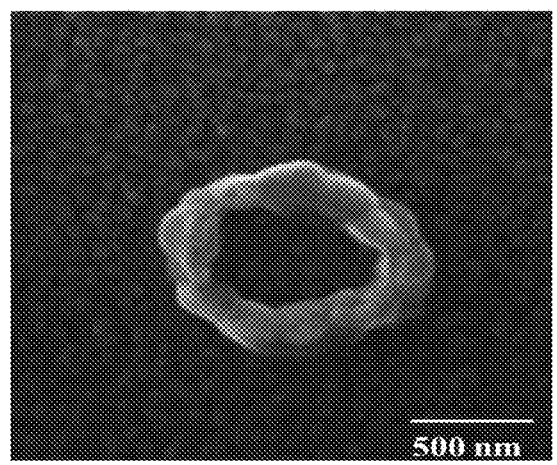
FIG. 9C illustrates the distribution of Ag nanorings at 303 kx magnification obtained after 6 h of annealing at 600° C. under pure nitrogen.

FIGS. 9A-9C are FESEM images of Ag nanorings obtained after 6 h of annealing at 600° C. under pure nitrogen at different magnifications. The inner diameter of the silver nanorings prepared is about 250 nm with a ring wall thickness of 80 nm.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. An $O_2$ reactive plasma/Ag sputtering method on zinc metal to form silver nanoparticles, comprising:
    forming a zinc oxide film by plasma reacting oxygen with a zinc metal target,
    sputtering silver onto the zinc oxide film to form a silver film on the zinc oxide film; and
    annealing the silver film to form the silver nanoparticles from the silver film;
    wherein the annealing is carried out at a temperature of 400-700° C. for a duration of 3-24 hours under an atmosphere of argon, nitrogen or air.

2. The method of claim 1, further comprising isolating the silver nanoparticles from the zinc oxide film.

3. The method of claim 1, wherein the silver film is formed by direct-current sputtering of silver on the zinc oxide film under argon plasma.

4. The method of claim 1, wherein the silver nanoparticles formed by the annealing have an average particle size of 20-350 nm and the average size of the silver nanoparticles increases with the temperature.

5. The method of claim 1, wherein the silver nanoparticles formed by the annealing have an average distance between particles of 350-3500 nm and the average distance between particles decreases with the temperature.

* * * * *